US012647137B2

(12) United States Patent　　(10) Patent No.:　US 12,647,137 B2
Kern et al.　　　　　　　　　(45) Date of Patent:　　　Jun. 2, 2026

(54) METHOD FOR DETERMINING A CODE WORD

(71) Applicant: Infineon Technologies AG, Neubiberg (DE)

(72) Inventors: Thomas Kern, Aschheim (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 106 days.

(21) Appl. No.: 18/733,912

(22) Filed: Jun. 5, 2024

(65) Prior Publication Data

US 2024/0411679 A1　Dec. 12, 2024

(30) Foreign Application Priority Data

Jun. 9, 2023　(DE) ..................... 10 2023 115 167.3

(51) Int. Cl.
H03M 13/51　　　(2006.01)
(52) U.S. Cl.
CPC .................................. H03M 13/51 (2013.01)
(58) Field of Classification Search
CPC ..................................................... H03M 13/51
See application file for complete search history.

(56) References Cited

U.S. PATENT DOCUMENTS

| | | | | |
|---|---|---|---|---|
| 3,559,168 A | * | 1/1971 | Carter et al. .......... | G06F 11/085 |
| | | | | 714/E11.031 |
| 9,805,771 B2 | | 10/2017 | Loibl et al. | |
| 10,951,240 B2 | | 3/2021 | Kern et al. | |
| 2020/0301614 A1 | * | 9/2020 | Kern ...................... | G11C 16/32 |
| 2020/0350931 A1 | * | 11/2020 | Kern ................ | H03M 13/3988 |
| 2021/0288673 A1 | * | 9/2021 | Kern ................ | H03M 13/3988 |

FOREIGN PATENT DOCUMENTS

DE　　　102018132503 A1　　6/2020

* cited by examiner

*Primary Examiner* — Joseph D Torres
(74) *Attorney, Agent, or Firm* — Eschweiler & Potashnik, LLC

(57)　　　　　　ABSTRACT

The determination of a code word is proposed, wherein (i) a bit group of n memory cells is read and n states are determined therefrom, the n states being determined in a time domain for each of at least two k-out-of-n codes, the at least two k-out-of-n codes having different k, (ii) the fact of whether a code word is present is determined for each of the at least two codes on the basis of the states, and (iii) when at least one code word is present, the code word of the k-out-of-n code having the largest k is used.

20 Claims, 9 Drawing Sheets

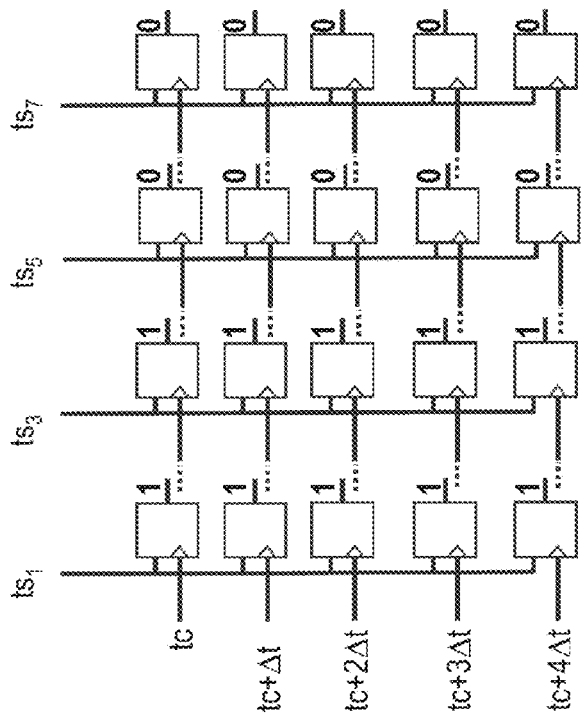
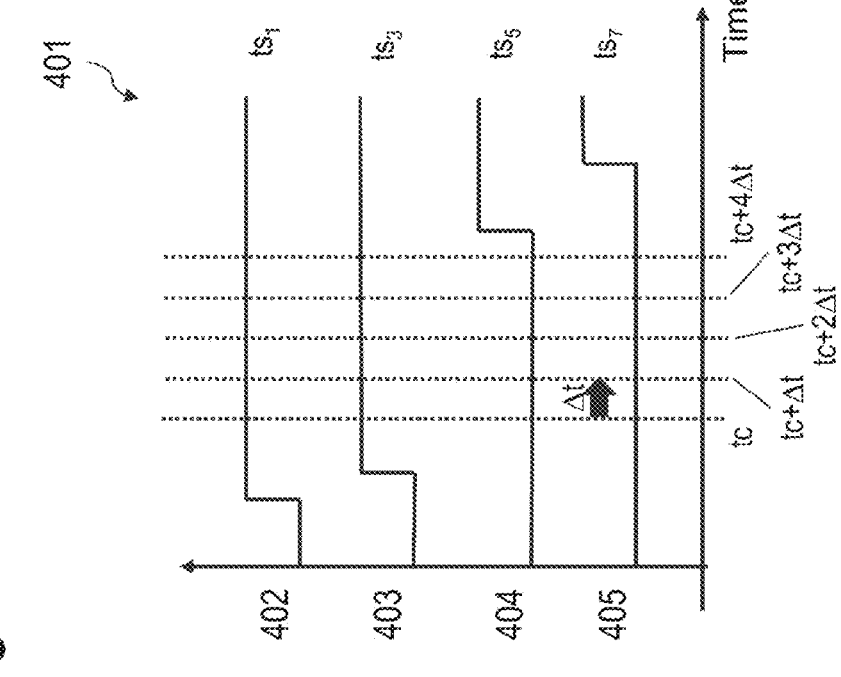
Fig.4

Fig.5

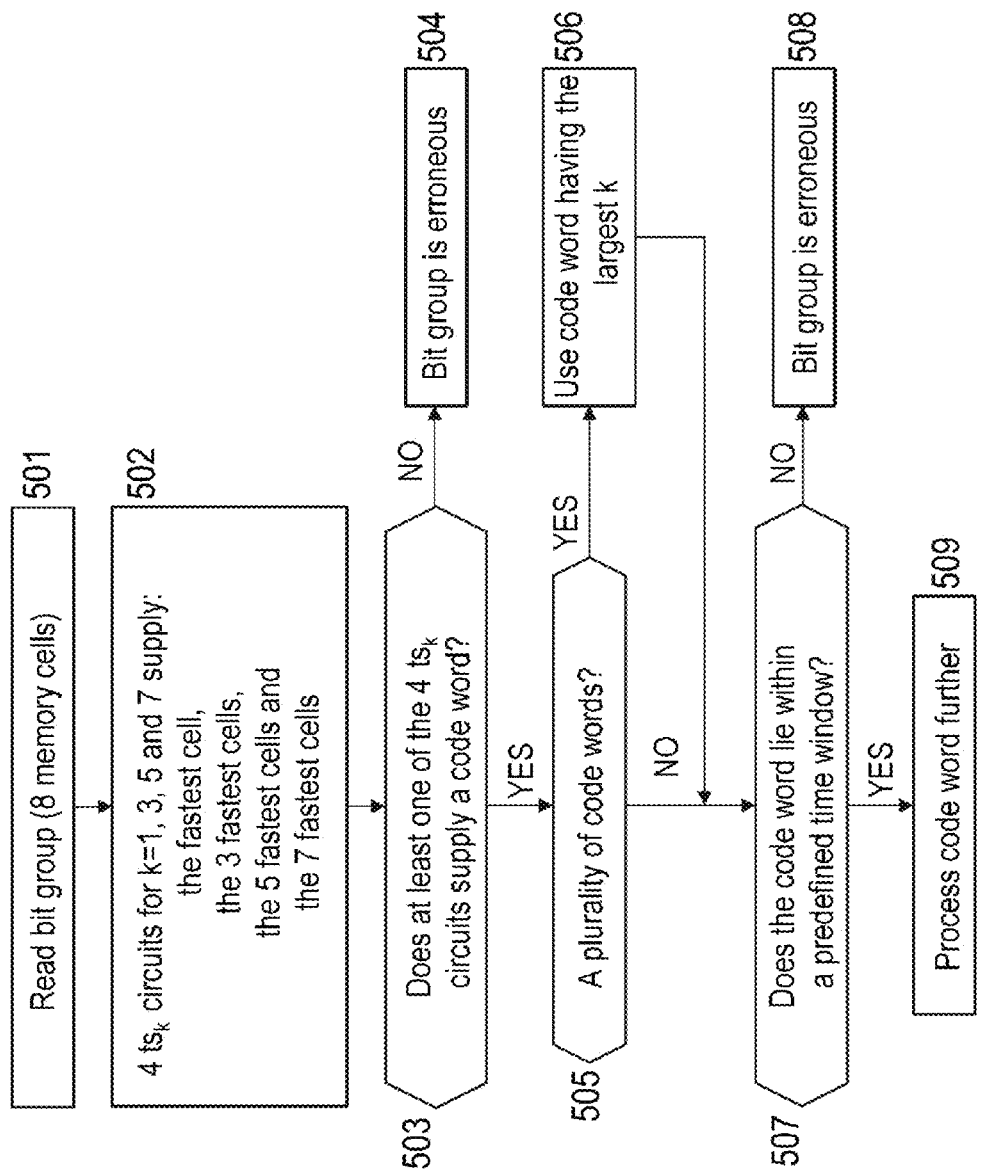

501 Read bit group (8 memory cells)

502 4 $ts_k$ circuits for k=1, 3, 5 and 7 supply:
the fastest cell,
the 3 fastest cells,
the 5 fastest cells and
the 7 fastest cells 503 Does at least one of the 4 $ts_k$ circuits supply a code word?

NO → 504 Bit group is erroneous

YES

505 A plurality of code words?

YES → 506 Use code word having the largest k

NO

507 Does the code word lie within a predefined time window?

NO → 508 Bit group is erroneous

YES → 509 Process code word further

Truth table:

| $D_8$ | Erasure | $V_7$ | $s4_7$ | $V_5$ | $s4_5$ | $v_3$ | $s4_3$ | $v_1$ | $s4_1$ |
|---|---|---|---|---|---|---|---|---|---|
| Error | 1 | 0 | 0 | 0 | 0 | 0 | 0 | 0 | 1 |
| $D_1$ | 0 | 0 | 0 | 0 | 0 | 0 | 0 | 1 | 1 |
| Error | 1 | 0 | 0 | 0 | 0 | 0 | 1 | X | 1 |
| $D_3$ | 0 | 0 | 0 | 0 | 0 | 1 | 1 | X | 1 |
| Error | 1 | 0 | 0 | 0 | 1 | X | 1 | X | 1 |
| $D_5$ | 0 | 0 | 0 | 1 | 1 | X | 1 | X | 1 |
| Error | 1 | 0 | 1 | X | 1 | X | 1 | X | 1 |
| $D_7$ | 0 | 1 | 1 | X | 1 | X | 1 | X | 1 |

Fig.9

METHOD FOR DETERMINING A CODE WORD

REFERENCE TO RELATED APPLICATIONS

This application claims priority to German Patent Application 10 2023 115 167.3, filed on Jun. 9, 2023, the contents of which are hereby incorporated by reference in their entirety.

TECHNICAL FIELD

The invention relates to the determination of code words, in particular the determination of whether a code word and, if appropriate, which code word ought to be processed further.

BACKGROUND

U.S. Pat. No. 9,805,771 B2 discloses transforming states from memory cells into the time domain during reading in order to be able to differentiate the states from one another in the temporal sequence in which they occur.

An object is to improve existing solutions and in particular to provide an approach for detecting code words which can be a code word from a plurality of k-out-of-n codes.

This object is achieved in accordance with the features of the independent claims. Preferred embodiments can be gathered from the dependent claims, in particular.

In order to achieve the object, a method is proposed for determining a code word, wherein a bit group of n memory cells is read and n states are determined therefrom, the n states being determined in a time domain for each of at least two k-out-of-n codes, the at least two k-out-of-n codes having different k, wherein the fact of whether a code word is present is determined for each of the at least two codes on the basis of the states, wherein, if at least one code word is present, the code word of the k-out-of-n code having the largest k is used.

In this case, it should be noted that, if only one code word is present, then this code word is used and the associated (sole) code has the largest k.

In particular, it is an option for the at least two k-out-of-n codes to be more than two k-out-of-n codes.

The memory can comprise for example bit groups each having n memory cells. It is possible for k-out-of-n code words (having identical or different k) to be stored in the bit groups.

In one development, if no code word is determinable for the at least two codes, a predefined action is carried out.

By way of example, an error message (erasure, erasure bit) can be implemented as the predefined action. Optionally (additionally or alternatively), it is possible to carry out an error correction for the bit group.

In one development, the code word is used only if it lies within a predefined time window.

In one development, the predefined time window is determined by a starting point and at least two time intervals.

Moreover, in order to achieve the object, a device for determining a code word is specified, comprising a processing unit, which is configured in such a way that the method described herein is able to be carried out.

Furthermore, a device for determining a code word is proposed, comprising a memory, at least two code circuit arrangements, configured for reading a bit group of n memory cells from the memory, determining n states based on the bit group read, the n states being determined in a time domain for each of at least two k-out-of-n codes, the at least two k-out-of-n codes having different k, a circuit for code checking, configured for determining whether a code word is present for each of the at least two k-out-of-n codes on the basis of the states, a code selection circuit, which is coupled to the circuit for code checking and which is configured for selecting the code word having the largest k if at least one code word is present.

In one development, the device furthermore comprises a selection circuit coupled to the at least two code circuit arrangements, the selection circuit being configured for providing strobe signals, in which case for each k-out-of-n code a strobe signal indicates whether a k-out-of-n data word was detected within a time window.

In one development, the code selection circuit is furthermore coupled to the selection circuit and the code selection circuit is furthermore configured for selecting the code word having the largest k if at least one code word is present and if this code word was detected within the time window.

In one development, the device furthermore comprises a multiplexer coupled to the code selection circuit, the code selection circuit furthermore being configured for controlling the multiplexer in such a way that the selected code word is provided at the output of the multiplexer.

In one development, the code selection circuit is furthermore configured for outputting error information if the data word having the largest k is not a code word.

Furthermore, a computer program product is proposed which is directly loadable into a memory of a digital computer, comprising program code parts configured to carry out steps of the method described here.

BRIEF DESCRIPTION OF THE DRAWINGS

The above-described properties, features and advantages and the way in which they are achieved will be explained further in association with the following schematic description of exemplary embodiments which are explained in greater detail in association with the drawings. In this case, identical or identically acting elements may be provided with identical reference signs, for the sake of clarity.

FIG. 4 shows a diagram with temporal profiles of the four switching signals $ts_1$, $ts_3$, $ts_5$ and $ts_7$ and a resulting allocation of the outputs of the selection circuit from FIG. 3.

FIG. 5 shows an exemplary flow diagram for determining whether a code word and, if appropriate, which code word can be processed further.

FIG. 9 shows an exemplary truth table such as can be realized at least partly in the code selection circuit shown in FIG. 8.

DETAILED DESCRIPTION

Figure 1:
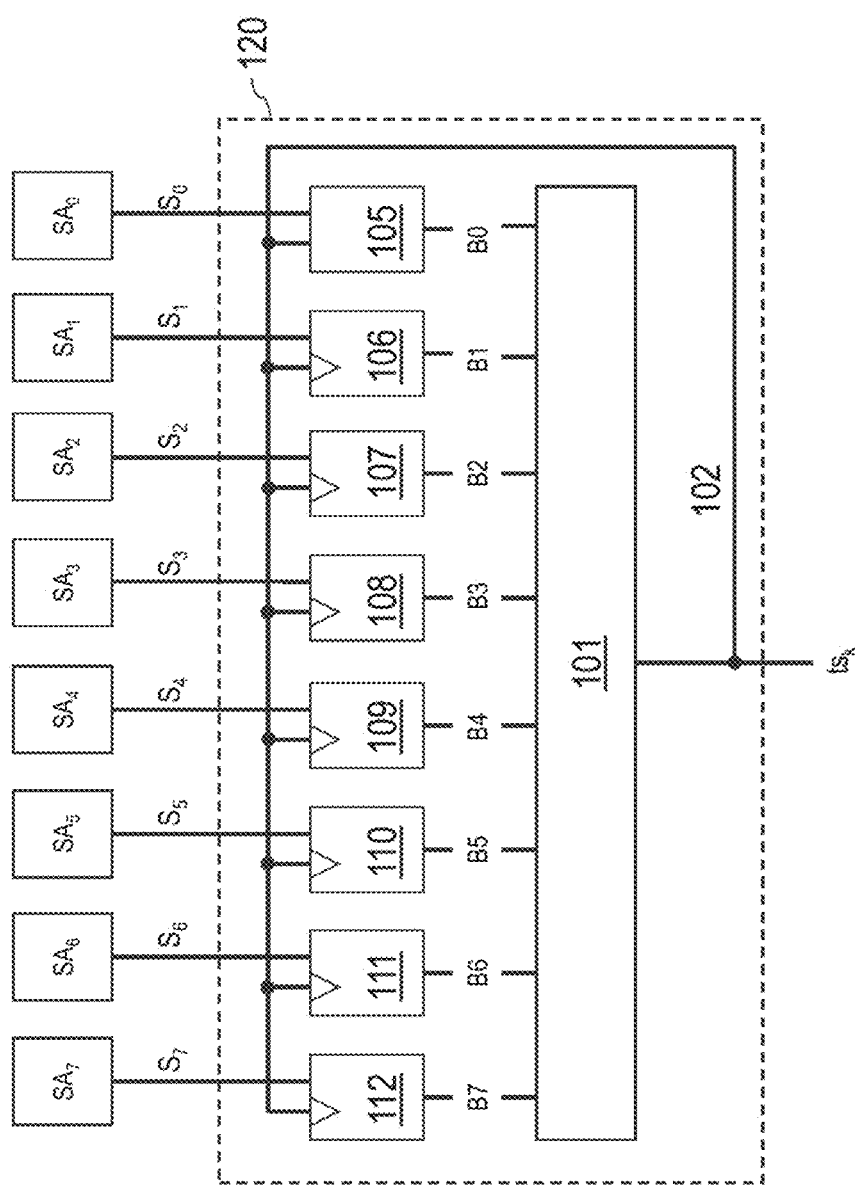
FIG. 1 shows an exemplary circuit arrangement for detecting the k fastest states (bits) of a k-out-of-8 code.

By way of example, in the context of using resistive memories (RRAMs or ReRAMs) complementary memory cells are used for storing information. In principle, two or more complementary memory cells can be used. In the case of complementary memory cells, a data bit is represented by (at least) two physical memory cells which have complementary states in the error-free case. By way of example, if two complementary memory cells A1 and A2 are used to represent a logic data bit, then the following can hold true:

A logic value "0" is present if the following holds true for the complementary memory cells A1 and A2: A1=0 and A2=1.

A logic value "1" is present if the following holds true for the complementary memory cells A1 and A2: A1=1 and A2=0.

In the error-free case, the two memory cells A1 and A2 thus always have complementary values: If the memory cell A1 has the value 0, then the memory cell A2 has the value 1, and vice versa.

Complementary memory cells can be used e.g. for arbitrary k-out-of-n codes. A code word of an exemplary 3-out-of-6 code has 6 bits, of which 3 bits always have either the value 0 or the value 1 and the remaining 3 bits in the error-free case have the value complementary thereto.

It generally holds true for a k-out-of-n code that there are $$\binom{n}{k}$$

code words each having k first values and (n-k) second values. It holds true that $$\binom{n}{k} = \frac{n!}{k! \cdot (n-k)!}.$$

If a k-out-of-8 code for 8 memory cells is considered, for example, this gives rise to the following for different k values:

k=1: There are 8 different code words.
k=3: There are 56 different code words.
k=5: There are 56 different code words.
k=7: There are 8 different code words.

If different k values are used in a multi-code implementation in accordance with this example, this gives rise to 128 code words. These 128 code words can be coded using 7 bits $(2^7=128)$. Such a multi-code implementation achieves a significant increase in efficiency compared with a simple 4-out-of-8 code with just 70 code words (allows 6 bits to be coded with 64 values).

The approach described here is suitable for RRAMs, but can also be used for other types of memory.

DE 10 2018 132 503 B4 discloses a circuit which determines the k fastest states in a k-out-of-n code. As soon as the k fastest states have occurred, the states are frozen.

The examples described herein determine a plurality of k fastest states. Based on the detection result, a code is determined or an error is output for the bit group.

A k-out-of-8 code where k=1, 3, 5, 7 is described by way of example below. The choice of k determines the distance between the errors and may be dependent on the respective implementation or error tolerance.

FIG. 1 shows an exemplary circuit arrangement for detecting the k fastest states (bits) of a k-out-of-8 code. Here n is 8 by way of example and a bit group of 8 memory cells is read.

Measuring amplifiers $SA_0$ to $SA_7$ supply states $S_0$ to $S_7$ of the 8 memory cells of a memory. These states are fed to a block 101 via latches 105 to 112 (e.g. realized as D-type flip-flops). In the block 101, the k fastest 1 states are detected and the states of the latches 105 to 112 are then frozen ("latched") by way of the signal 102.

Therefore, as soon as the signal 102 of the block 101 switches from 0 to 1, the k fastest 1 states have been detected and the latches 105 to 112 are stopped in such a way that the output signals provided by them no longer change. At this "frozen" point in time, the k fastest 1 states are present at the outputs of the latches 105 to 112. At the outputs of the latches 105 to 112, the states in the form of the bits B0 to B7 can be tapped off and processed further and/or stored.

The signal 102 also serves as a switching signal $ts_k$, where k again denotes the number of fastest bits determined by the circuit.

The block 101 comprises an associated logic circuit that enables the k fastest 1 states to be detected. By way of example, by means of such a logic circuit, at the point in time when the k fastest 1 states occur, all the states can be frozen by means of a signal 102. This is done for example by way of a logic combination of the output signals B0 to B7 of the latches 105 to 112: As soon as a possible combination of k 1 states is present, the latches 105 to 112 are frozen by way of the signal 102. Details concerning an exemplary setup of such a logic circuit 101 are described for example in DE 10 2018 132 503 B4.

A block 120 denotes that part of the circuit arrangement, also referred to hereinafter as $ts_k$ circuit (or code circuit arrangement), which, based on the states $S_0$ to $S_7$ of the memory cells of the bit group, determines the k fastest bits and supplies the switching signal $ts_k$.

In the example described here, four such $ts_k$ circuits are provided for the different k fastest bits where k=1, 3, 5, 7, each of the circuit arrangements providing one of the switching signals $ts_1$, $ts_3$, $ts_5$ and $ts_7$.

Figure 2:
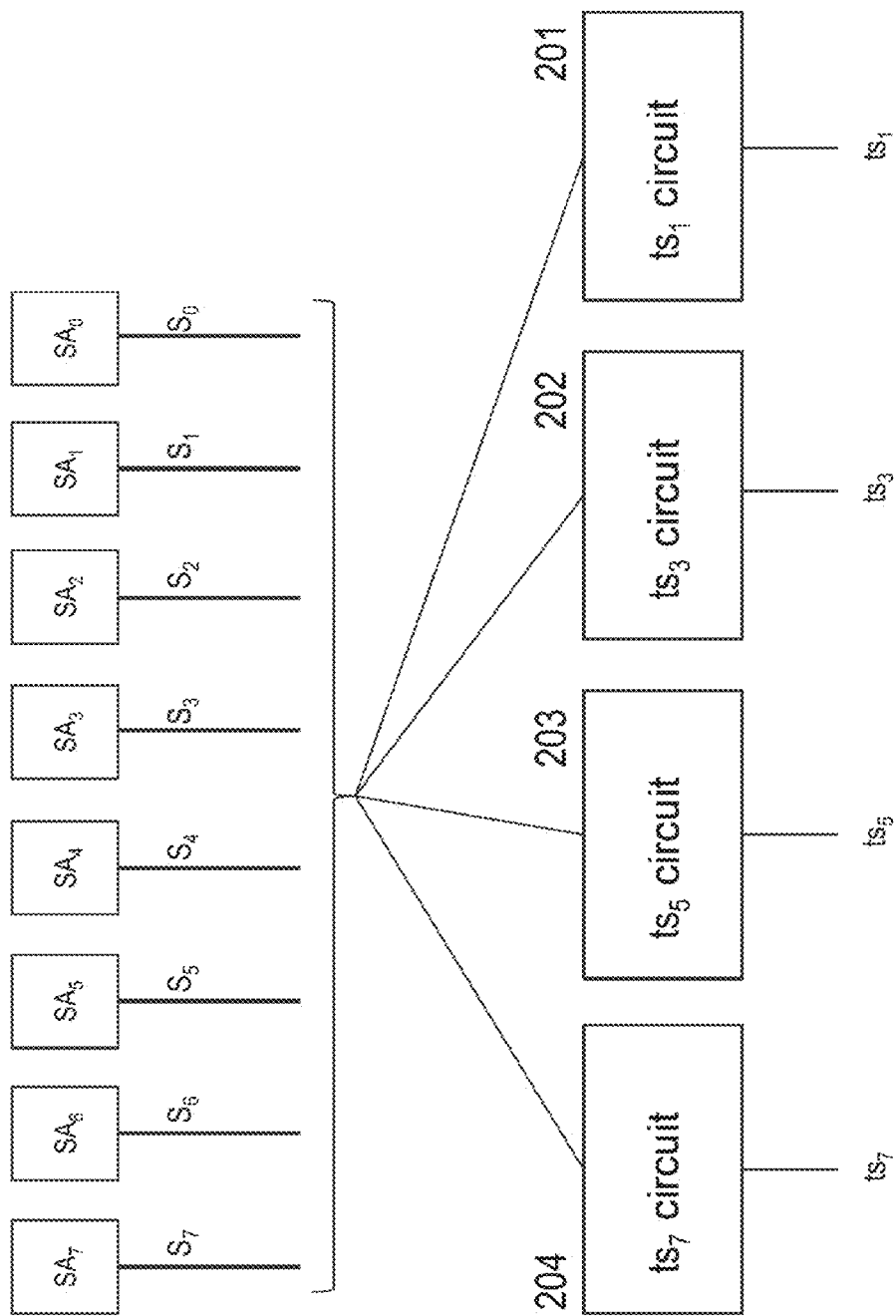
FIG. 2 shows an exemplary arrangement for a bit group having 8 bits and four $ts_k$ circuits (code circuit arrangements) for k=1, 3, 5, 7.

FIG. 2 shows an exemplary arrangement for a bit group having 8 bits and the four $ts_k$ circuits 201 to 204 for k=1, 3, 5, 7. For the sake of clarity, the wiring of the outputs of the measuring amplifiers $SA_0$ to $SA_7$ is represented symbolically: Each state $S_0$ to $S_7$ is passed (in parallel) to each of the $ts_k$ circuits 201 to 204. Consequently, in parallel the one fastest memory cell is ascertained with the aid of the $ts_1$ circuit 201, the three fastest memory cells are ascertained with the aid of the $ts_3$ circuit 202, the five fastest memory cells are ascertained with the aid of the $ts_5$ circuit 203, and the seven fastest memory cells are ascertained with the aid of the $ts_7$ circuit 204.

Accordingly, the $ts_k$ circuits 201 to 204 provide the switching signals $ts_1$, $ts_3$, $ts_5$ and $ts_7$. The $ts_k$ circuit is also described as a code circuit arrangement because a specific k-out-of-n code is associated therewith.

Figure 3:
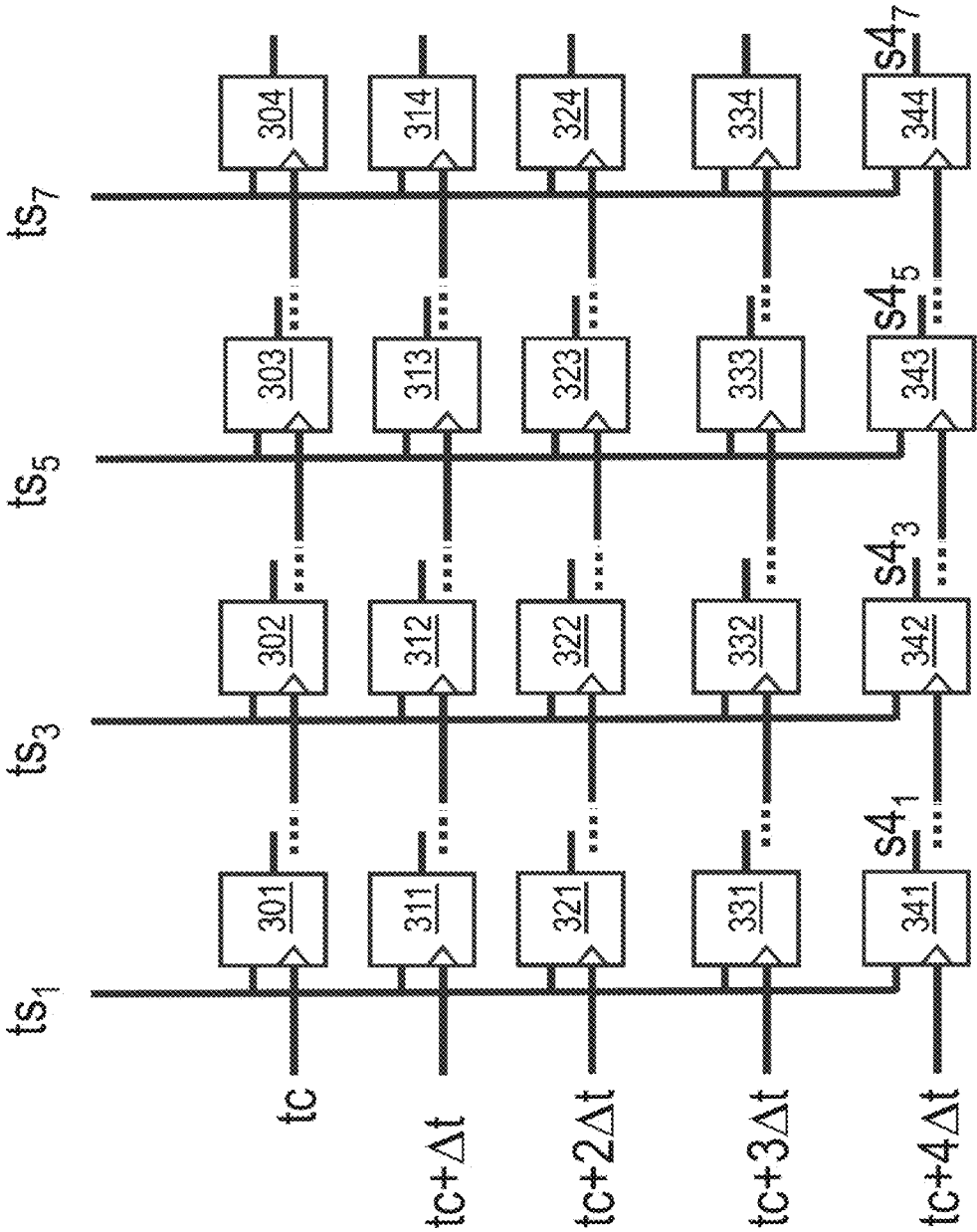
FIG. 3 shows an exemplary arrangement (selection circuit) for further processing of the switching signals $ts_1$, $ts_3$, $ts_5$ and $ts_7$.

FIG. 3 shows an exemplary arrangement for further processing of the switching signals $ts_1$, $ts_3$, $ts_5$ and $ts_7$. This arrangement is also referred to as a selection circuit. In this example, at different points in time $$tc + i \cdot \Delta t,$$

where i=0, . . . , 4, the states of the switching signals $ts_1$, $ts_3$, $ts_5$ and $ts_7$ are stored. FIG. 3 shows exemplary storage by means of latches: the associated latches are frozen at the desired points in time of storage.

In this respect, FIG. 3 shows 16 latches 301 to 304, 311 to 314, 321 to 324, 331 to 334 and 341 to 344, which are connected to the switching signals $ts_1$, $ts_3$, $ts_5$ and $ts_7$. The switching signal $ts_1$ is fed to the latches 301, 311, 321, 331 and 341, the switching signal $ts_3$ is fed to the latches 302, 312, 322, 332 and 342, the switching signal $ts_5$ is fed to the latches 303, 313, 323, 333 and 343, and the switching signal $ts_7$ is fed to the latches 304, 314, 324, 334 and 344.

At the point in time tc the latches 301 to 304 are frozen, at the point in time tc+$\Delta t$ the latches 311 to 314 are frozen, at the point in time tc+$2\Delta t$ the latches 321 to 324 are frozen, at the point in time tc+$3\Delta t$ the latches 331 to 334 are frozen, and at the point in time tc+$4\Delta t$ the latches 341 to 344 are frozen. At the output of the latches 341 to 344 strobe signals $s4_1$, $s4_3$, $s4_5$ and $s4_7$ are present, indicating the state of the switching signals $ts_1$, $ts_3$, $ts_5$ and $ts_7$ at the point in time tc+$4\Delta t$.

FIG. 4 shows a diagram 401 with temporal profiles 402 to 405 of the four switching signals $ts_1$, $ts_3$, $ts_5$ and $ts_7$. The diagram 401 reveals that the switching signals $ts_1$, $ts_3$, $ts_5$ and $ts_7$ change from 0 to 1 at different points in time and thus indicate that the respective number of fastest memory cells has been detected.

At the points in time tc, tc+$\Delta t$, tc+$2\Delta t$, tc+$3\Delta t$ and tc+$4\Delta t$ the states of the switching signals $ts_1$, $ts_3$, $ts_5$ and $ts_7$ are frozen according to the circuit shown in FIG. 3. The diagram 401 illustrates these points in time, each of which is determined by addition of the time duration $\Delta t$.

The point in time tc thus determines the beginning of a read time window, the end of which is defined by the last point in time tc+$4\Delta t$ illustrated here.

FIG. 4 furthermore includes the arrangement from FIG. 3 with an allocation of the outputs of the latches based on the profiles 402 to 405. It is thus discernible that at all the points in time tc to tc+$4\Delta t$ the switching signals $ts_1$ and $ts_3$ are equal to 1 and the switching signals $ts_5$ and $ts_7$ are equal to 0. In other words, at the point in time tc+$4\Delta t$ a 1-out-of-8 code word and a 3-out-of-8 code word are detected, but not a 5-out-of-8 code word, nor a 7-out-of-8 code word. An explanation is given below of how a decision can be taken as to which of the code words detected within the time window is processed further.

FIG. 5 shows an exemplary flow diagram for determining whether a code word can be processed further; and, if appropriate, which code word can be processed further.

In a step 501, a bit group is read. In the present example, 8 memory cells are read as the bit group.

In a step 502, by means of four $ts_k$ circuits, the fastest cell, the 3 fastest cells, the 5 fastest cells and the 7 fastest cells are determined based on the signals or states read.

A step 503 involves checking whether at least one of the $ts_k$ circuits supplies a code word. In this context, code word means for k=1: a 1-out-of-8 code word,
    k=3: a 3-out-of-8 code word,
    k=5: a 5-out-of-8 code word, and
    k=7: a 7-out-of-8 code word.

If no code word is present, the bit group is detected as erroneous (step 504).

A step 505 involves checking whether a plurality of code words have been determined. If this is the case, then that code word having the largest k is selected in a step 506 and the method branches to a step 507.

If only one code word is present, then the method branches directly from step 505 to step 507.

The step 507 involves checking whether the code word was determined within a predefined time window. If this is not the case, the bit group is detected as erroneous (step 508).

If the code word lies within the predefined time window, then the method branches to a step 509 and the code word is processed further.

The approach described here is able to be realized in particular (also) using hardware, which has an advantageous effect on the read times. A further advantage is in erroneous bit groups being detectable, since error correction mechanisms can better correct errors limited to groups than non-localized errors.

One option is in the code distance being able to be predefined as desired. By way of example, a larger code distance makes it possible to increase the robustness vis-n-vis errors. In this regard, values for k=1, 4 and 7 could be used, for example.

One option is for example in other codes being able to be used as well, code words of successive codes differing in terms of their code distance.

In particular, it can be advantageous to determine the number of $ts_k$ circuits such that the sum of the code words corresponding to the $ts_k$ circuits results in a power of two.

Optionally, the code distance between successive $ts_k$ circuits can vary.

Figure 6:
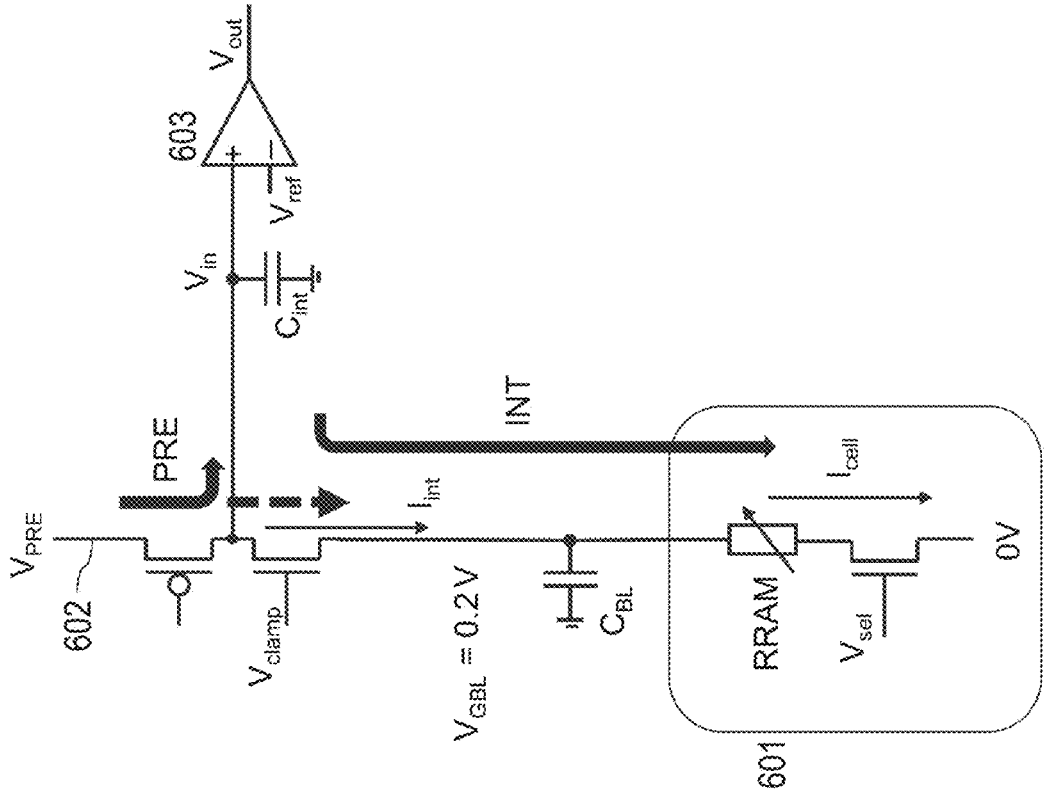
FIG. 6 shows a schematic diagram of a sense amplifier for a memory cell.

FIG. 6 shows a schematic diagram of a sense amplifier for a memory cell 601.

The memory cell 601 is illustrated by way of example as an RRAM memory cell. The memory cell 601 is selected via a MOSFET by means of a voltage $V_{sel}$ and a current $I_{cell}$ flows through the memory cell.

Reading can be subdivided into two phases, a pre-charge phase and a measuring phase (sense phase).

A bit line 602 is pre-charged by means of a voltage $V_{PRE}$ (pre-charge voltage) to a portion of the pre-charge voltage (e.g. 0.2 V). A voltage Vin corresponding to the voltage $V_{PRE}$ is present at the positive input of an operational amplifier 603. The positive input of the operational amplifier (comparator) 603 is connected to ground via a capacitor $C_{int}$. A reference voltage $V_{ref}$ is present at the negative input of the operational amplifier 603. The operational amplifier 603 supplies an output voltage $V_{out}$ at its output.

Figure 7:
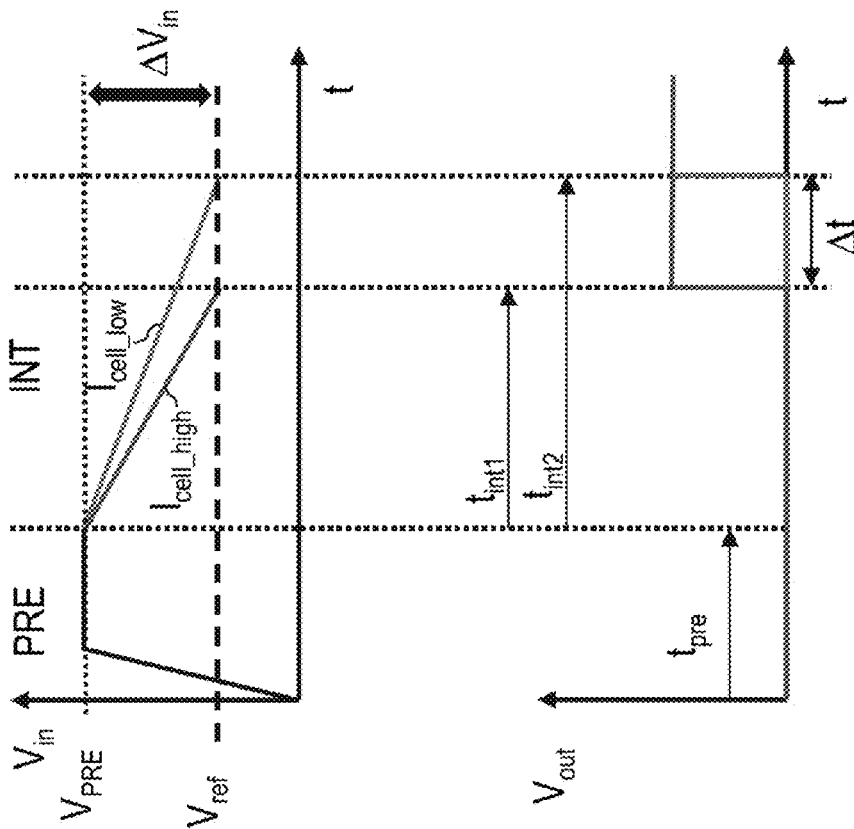
FIG. 7 shows a diagram of the voltage Vin and the output voltage Vout at the sense amplifier in accordance with FIG. 6 versus time t.

FIG. 7 shows a diagram of the voltage Vin and the output voltage Vout versus time t.

Two phases are described below, a pre-charge phase PRE and an integration phase INT.

During the time $t_{pre}$, the bit line 602 and the capacitor $C_{int}$ are pre-charged. The time $t_{pre}$ is approximately 5 ns, for example. During the pre-charge phase PRE, the voltage Vin rises to a voltage $V_{PRE}$.

The integration phase INT is also referred to as measuring phase; it follows the pre-charge phase PRE and is determined by a time tint, where it holds true that $$t_{int} = \Delta V_{in} \cdot \frac{C_{int}}{I_{cell}},$$

where

-continued $$\Delta V_{in} = V_{PRE} - V_{ref}.$$

If the memory cell 601 has a high resistance value, then a lower current $I_{cell}=I_{cell\_low}$ flows through the memory cell. By contrast, if the resistance value is low, then the cell current $I_{cell}=I_{cell\_high}$ is greater than $I_{cell\_low}$. During the integration phase, in accordance with the equation above, different time durations tint arise, a shorter time duration $t_{int1}$ for the high cell current $I_{cell\_high}$ and a longer time duration $t_{int2}$ for the lower cell current $I_{cell\_low}$. The difference between these two time durations is $$\Delta t = t_{int2} - t_{int1}.$$

Precisely this difference $\Delta t$ between the different cell states can be used for parameterizing the storage times $$tc + i \cdot \Delta t$$

in accordance with the explanations above. Advantageously, the time duration tc can be chosen in a range of between 3 ns and 5 ns.

Preferably, the time duration tc can be adapted such that it is determined by the typical integration time for a high-current cell ($I_{cell\_high}$) and a low-current cell ($I_{cell\_low}$). A maximum time duration tc can also be determined by $$t_{readmax} - t_{pre},$$

where $t_{readmax}$ denotes the maximum read access time.

Further Advantages and Examples

The approaches shown here make possible a multi-code approach without the use of reference currents for differentiating the codes. For each code a dedicated circuit is used (also referred to as $ts_k$ circuit in the example above) in order to provide a switching signal $ts_k$ if a code word (of a k-out-of-n code) has possibly been detected. This is followed by checking as to whether, after freezing, a code word is also present in the latches. This is necessary for example because, between the detection of the k fastest bits and the actual freezing of the latches, a further bit might have changed its state and k+1 bits were thus incorrectly frozen. No code word of the k-out-of-n code is then present. Furthermore, it is advantageously proposed to carry out a prioritization in such a way that in the case where a plurality of code words (of different codes) are detected, that code word having the largest k is used and processed further. This is advantageously done in relation to a predefined time window that determines a period of validity for the code words.

Exemplary Implementation

Figure 8:
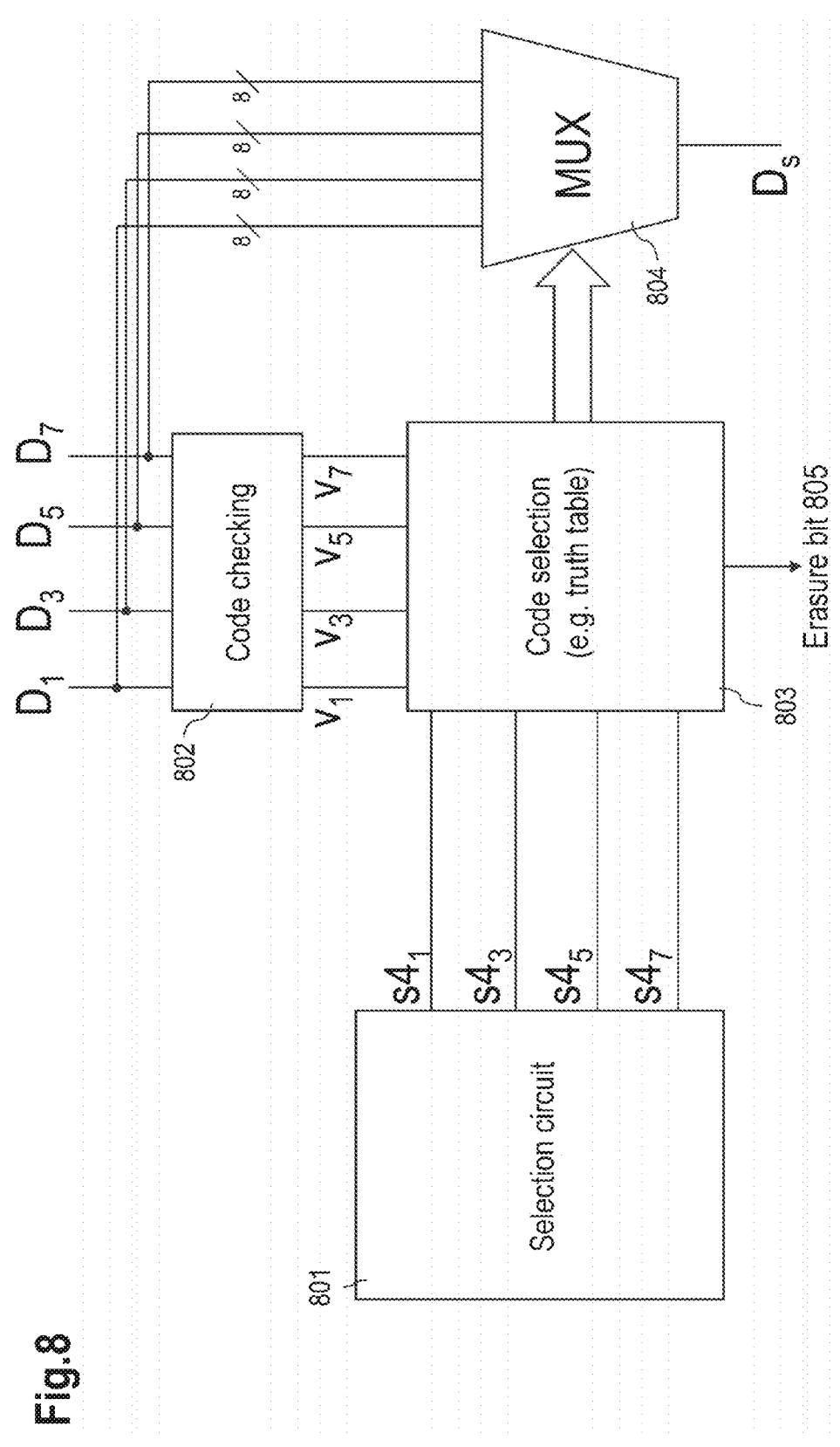
FIG. 8 shows a block diagram for selecting a code word or outputting a so-called erasure.

FIG. 8 shows an exemplary schematic block diagram for determining or selecting a code word or alternatively a so-called "erasure" for the case where no code word or no code word to be used was detected. The erasure can be for example a bit (or flag) indicating that the bit group was detected as erroneous or that a detected code word ought not to be used.

A selection circuit 801 supplies the strobe signals $s4_1$, $s4_3$, $s4_5$ and $s4_7$ (see FIG. 3 with explanations).

The frozen data words $D_k$ for k=1, 3, 5, 7 are provided to a code checking circuit 802. As was explained in association with FIG. 1 and FIG. 2, there is one $ts_k$ circuit each for k=1, 3, 5, 7. After freezing, each of these circuits supplies a data word $D_k$ having the bits B0 to B7 in accordance with FIG. 1.

The code checking circuit 802 then establishes for each data word $D_k$ whether a code word is involved. One reason is that although the circuit shown in FIG. 1 attempts to determine (only) the k fastest bits, more than k bits can actually be frozen and the frozen data word $D_k$ is therefore not a k-out-of-n code word. The code checking circuit 802 thus checks whether the data word $D_1$ of the $ts_1$ circuit 201 is a 1-out-of-8 code word (k=1), the data word $D_3$ of the $ts_3$ circuit 202 is a 3-out-of-8 code word (k=3), the data word $D_5$ of the $ts_5$ circuit 203 is a 5-out-of-8 code word (k=5), and the data word $D_7$ of the $ts_7$ circuit 204 is a 7-out-of-8 code word (k=7).

If this is the case, i.e. if the respective k-out-of-8 code word is present, then that is indicated by way of example by means of a validity bit $v_k$ for the respective k-out-of-8 code (k=1, 3, 5, 7).

For example, the code checking circuit can be realized by means of gate logic in such a way that, for each k-out-of-8 code, a check is made to ascertain whether the data word $D_k$ is a code word: For $D_1$, for example, the following Boolean logic can be realized by means of gates:

$$\begin{aligned}
&(B0 \wedge \neg B1 \wedge \neg B2 \wedge \neg B3 \wedge \neg B4 \wedge \neg B5 \wedge \neg B6 \wedge \neg B7)\vee \\
&(\neg B0 \wedge B1 \wedge \neg B2 \wedge \neg B3 \wedge \neg B4 \wedge \neg B5 \wedge \neg B6 \wedge \neg B7)\vee \\
&(\neg B0 \wedge \neg B1 \wedge B2 \wedge \neg B3 \wedge \neg B4 \wedge \neg B5 \wedge \neg B6 \wedge \neg B7)\vee \\
&(\neg B0 \wedge \neg B1 \wedge \neg B2 \wedge B3 \wedge \neg B4 \wedge \neg B5 \wedge \neg B6 \wedge \neg B7)\vee \\
&(\neg B0 \wedge \neg B1 \wedge \neg B2 \wedge \neg B3 \wedge B4 \wedge \neg B5 \wedge \neg B6 \wedge \neg B7)\vee \\
&(\neg B0 \wedge \neg B1 \wedge \neg B2 \wedge \neg B3 \wedge \neg B4 \wedge B5 \wedge \neg B6 \wedge \neg B7)\vee \\
&(\neg B0 \wedge \neg B1 \wedge \neg B2 \wedge \neg B3 \wedge \neg B4 \wedge \neg B5 \wedge B6 \wedge \neg B7)\vee \\
&(\neg B0 \wedge \neg B1 \wedge \neg B2 \wedge \neg B3 \wedge \neg B4 \wedge \neg B5 \wedge \neg B6 \wedge B7)
\end{aligned}$$

The result of this logic is 1 only if one of the 1-out-of-8 code words 1000 0000, 0100 0000, 0010 0000, 0001 0000, 0000 1000, 0000 0100, 0000 0010, 0000 0001 is present. Corresponding logics can be provided for the 56 3-out-of-8 code words, the 56 5-out-of-8 code words and the 8 7-out-of-8 code words.

The strobe signals $s4_1$, $s4_3$, $s4_5$ and $s4_7$ and the validity bits $v_1$, $v_3$, $v_5$ and $v_7$ are fed to a code selection circuit 803. On the basis of these input signals, the code selection circuit 803 either selects a data word as code word for further processing or else indicates by means of the erasure that no code word or no suitable code word can/ought to be selected.

The decision can be taken in the code selection circuit 803 by means of a truth table. FIG. 9 shows an exemplary truth table of this type.

As described above, the code word having the largest k is intended to be processed further. In this example, k=7 is the largest value for k. Accordingly, if available within the time window, the data word $D_7$ ought to be selected, although only if it is also a code word of the 7-out-of-8 code. If a data word $D_7$ is present which is not a code word of the 7-out-of-8 code, an error is indicated by means of the erasure. No other code word having a smaller k is then used either.

The letter "X" in the truth table indicates that this value does not matter for the respective row.

If it is detected that the data word having the largest k is a code word, this is selected. This is done in accordance with the arrangement shown in FIG. 8, by way of example, by means of a multiplexer (MUX) 804 controlled by the code selection circuit 803. On the input side, the 8-bit-wide data words $D_1$, $D_3$, $D_5$ and $D_7$ are passed to the MUX 804. The code selection circuit controls the MUX 804 such that the data word which satisfies the conditions described here is provided as the selected data word $D_s$. If none of the data words $D_1$, $D_3$, $D_5$ and $D_7$ are selectable, this can be indicated by an erasure bit 805, for example. Alternatively, in this case, a further input of the MUX 804 could be selected, which provides at the output a predefined bit combination (which is different than the selectable code words) which is able to be taken as a basis for detecting that an error is present and no data word could be selected.

The erasure bit 805 indicates whether or not the data word having the largest k that occurs in the time window is a code word. If it is not a code word, then by way of example the erasure bit is equal to 1, an error is indicated and no code word (not even a code word having a smaller k) is selected.

Further Examples and Observations

For example, the functions described herein can be implemented at least in part using hardware, e.g. specific hardware components and/or a processor. In particular, the functions can be realized by means of hardware, processors, software, firmware or any desired combinations thereof.

If implemented using software, the functions can be stored on a computer-readable medium or can be transmitted as one or more instructions or program code and can be executed by a hardware-based processing unit. Computer-readable media can include computer-readable storage media corresponding to physical media, for example data storage media, or communication media comprising an arbitrary medium that enables a computer program to be transmitted, for example using a communication protocol. In this way, computer-readable media can correspond to physical, non-volatile computer-readable storage media or communication media, for example in the form of signals.

Data storage media can be any available media which can be accessed by one or more computers or one or more processors in order to retrieve instructions, code and/or data structures for implementing the techniques described in this disclosure. A computer program product can include a computer-readable medium.

By way of example, computer-readable storage media can comprise RAM, ROM, EEPROM, CD-ROM, optical disk storage, magnetic disk storage or magnetic storage devices, flash memory or any other medium which can be used to store program code in the form of instructions or data structures which can be accessed by a computer.

Moreover, an arbitrary connection is referred to as a computer-readable medium, that is to say as a computer-readable transmission medium. For example, if instructions are transmitted from a website, a server or some other remote source via a connection, e.g. coaxial cable, optical fiber cable, twisted pair, digital subscriber line (DSL), or wireless technology, e.g. infrared, radio and microwave, then such a connection is part of the definition of the medium.

By contrast, computer-readable storage media are directed at physical storage media, e.g. compact disk (CD), laser disk, optical disk, digital versatile disk (DVD), floppy disk and Blu-ray disk. Storage media can be magnetic or optical storage media.

Computer-readable storage media can comprise combinations of the storage media above.

Instructions can be executed for example by one or more of the following components:

a processor, a central processing unit (CPU), a digital signal processor (DSP), a microprocessor, an application-specific integrated circuit (ASIC), a field programmable logic array (FPGA), an integrated logic circuit, a discrete logic circuit.

Accordingly, the term processor can relate to any of the above structures (including in combination) or any other structure suitable for the implementation.

In addition, the functionality described here can be provided in fixedly assigned hardware and/or software modules which are designed for coding and decoding, or integrated in a combined codec. Moreover, the techniques could be implemented completely in one or more circuits and/or logic elements.

The techniques can be implemented in a multiplicity of apparatuses or devices, including a wireless handheld apparatus, an integrated circuit (IC) or a series of integrated circuits, for example including in a chipset. Various components, modules or units are mentioned, including for addressing functional aspects of apparatuses, which are configured to implement the solutions described here but do not necessarily require a realization by way of different hardware units. Rather, various units can be combined in a single hardware unit or can be provided by a collection of inter-operative hardware units, including one or more processors, as described above, in conjunction with suitable software and/or firmware.

Although various exemplary embodiments have been disclosed, it is evident to a person skilled in the art that various changes and modifications can be made in order to attain the advantages of the solutions described here, without departing from the subject matter disclosed here. In particular, other components which fulfil the same functions can be used in a suitable manner.

It should be pointed out that features explained with reference to a specific figure can be combined with features of other figures, even in the cases in which this is not explicitly mentioned. Furthermore, the methods described can be realized either in software implementations by the use of suitable processor instructions or in hybrid implementations that use a combination of hardware and software. Such modifications of the solutions described here are covered by the accompanying claims.

What is claimed is:

1. A method for determining a code word, reading a bit group of n memory cells and determining n states from the bit group of n memory cells, the n states being determined in a time domain for each of at least two k-out-of-n codes, the at least two k-out-of-n codes having different k, determining whether a code word is present for each of the at least two k-out-of-n codes based on the states, when at least one code word is present, using the code word of the k-out-of-n code having the largest k.

2. The method as claimed in claim 1, wherein, when no code word is determinable for the at least two k-out-of-n codes, a predefined action is carried out.

3. The method as claimed in claim 1, wherein the code word of the k-out-of-n code having the largest k is used only when the code word lies within a predefined time window.

4. The method as claimed in claim 3, wherein the predefined time window is determined by a starting point and at least two time intervals.

5. A device for determining a code word comprising a processing unit configured to carry out the method as claimed in claim 1.

6. A non-transitory computer readable medium, comprising program code parts configured to carry out the method as claimed in claim 1.

7. A device for determining a code word, comprising a memory, at least two code circuit arrangements, configured to read a bit group of n memory cells from the memory, determine n states based on the bit group read, the n states being determined in a time domain for each of at least two k-out-of-n codes, the at least two k-out-of-n codes having different k, a code check circuit, the code check circuit configured to determine whether a code word is present for each of the at least two k-out-of-n codes based on the states, a code selection circuit, which is coupled to the code check circuit and which is configured to select the code word having the largest k when at least one code word is present.

8. The device as claimed in claim 7, further comprising:

a selection circuit coupled to the at least two code circuit arrangements, the selection circuit being configured to provide strobe signals, wherein for each k-out-of-n code a strobe signal indicates whether a k-out-of-n data word was detected within a time window.

9. The device as claimed in claim 8, wherein the code selection circuit is further coupled to the selection circuit and wherein the code selection circuit is further configured to select the code word having the largest k when at least one code word is present and when this code word was detected within the time window.

10. The device as claimed in claim 9, further comprising:

a multiplexer coupled to the code selection circuit, the code selection circuit further configured to control the multiplexer so the selected code word is provided at an output of the multiplexer.

11. The device as claimed in claim 9, wherein the code selection circuit is further configured to output error information when a data word having the largest k is not a code word.

12. A device, comprising a memory, a first circuit coupled to the memory, the first circuit configured to:

read data from a bit group of n memory cells, the bit group of n memory cells included in the memory, and determine n states based on the data read from the bit group, the n states being determined in a time domain for each of at least two k-out-of-n codes, the at least two k-out-of-n codes having different values of k, a second circuit coupled to the first circuit, the second circuit configured to determine whether a code word is present for each of the at least two k-out-of-n codes based on the n states; and a third circuit coupled to the second circuit, the third circuit configured to select the code word having the largest value of k.

13. The device as claimed in claim 12, further comprising:

a fourth circuit coupled to the first circuit, the fourth circuit being configured to provide strobe signals, wherein for each k-out-of-n code a strobe signal indicates whether a k-out-of-n data word was detected within a time window.

14. The device as claimed in claim 13, wherein the third circuit is further coupled to the fourth circuit and wherein the third circuit is further configured to select the code word having the largest value of k when at least one code word is present and when this code word was detected within the time window.

15. The device as claimed in claim 14, further comprising:

a multiplexer coupled to the third circuit, the third circuit further configured to control the multiplexer so the selected code word is provided at an output of the multiplexer.

16. The device as claimed in claim 14, wherein the third circuit is further configured to output error information when a data word having the largest value of k is not a code word.

17. The device as claimed in claim 12, wherein, when no code word is determined to be present for the at least two k-out-of-n codes, a predefined action is carried out.

18. The device as claimed in claim 12, wherein the code word of the k-out-of-n code having the largest value of k is used only when the code word lies within a predefined time window.

19. The device as claimed in claim 18, wherein the predefined time window is determined by a starting point and at least two time intervals.

20. The device as claimed in claim 12, wherein the first circuit includes a complementary memory cell in which a data bit is stored in at least two memory cells of the complementary memory cell, and the at least two memory cells store complementary data states in an error-free case.

* * * * *